US006665527B2

United States Patent
Schiltz

(10) Patent No.: US 6,665,527 B2
(45) Date of Patent: Dec. 16, 2003

(54) DOUBLE BALANCED MIXER CIRCUIT

(75) Inventor: Thomas E. Schiltz, Colorado Springs, CO (US)

(73) Assignee: Motorola, Inc., Schaumburg, IL (US)

( * ) Notice: Subject to any disclaimer, the term of this patent is extended or adjusted under 35 U.S.C. 154(b) by 531 days.

(21) Appl. No.: 09/726,926

(22) Filed: Nov. 30, 2000

(65) Prior Publication Data

US 2002/0065061 A1 May 30, 2002

(51) Int. Cl.[7] .............................. H04B 1/26; H04B 1/28
(52) U.S. Cl. ...................... 455/326; 455/313; 455/333; 327/113
(58) Field of Search ................................ 455/313, 318, 455/319, 323, 325, 326, 327, 333, 330; 327/113, 359

(56) References Cited

U.S. PATENT DOCUMENTS

| | | | | |
|---|---|---|---|---|
| 5,521,545 A | * | 5/1996 | Terry et al. ................. | 327/359 |
| 5,875,392 A | * | 2/1999 | Tanaka ........................ | 455/321 |
| 6,026,286 A | * | 2/2000 | Long .......................... | 455/327 |
| 6,140,849 A | * | 10/2000 | Trask ......................... | 327/113 |
| 6,230,001 B1 | * | 5/2001 | Wyse .......................... | 455/326 |
| 6,242,964 B1 | * | 6/2001 | Trask ......................... | 327/359 |
| 6,529,721 B1 | * | 3/2003 | Tiller ......................... | 455/323 |

* cited by examiner

*Primary Examiner*—Quochien Vuong

(57) ABSTRACT

A double balanced mixer circuit 10 receives an input signal ($RF_{IN}$) at first input terminals (14), supplying that signal to the primary side of a transformer (12). The secondary side of the transformer (12) is coupled to the bases of transistors (18 and 26) that supply the tail currents to a pair of differential transistors. The center tap of transformer (12) receives a voltage ($V_{BIAS}$) that keeps the transistors (18 and 26) biased in their linear regions. A capacitor (16) provides an AC ground at the center tap point of the transformer (12). The first differential transistor pair (20 and 22) and the second differential transistor pair (28 and 30) receive a differential signal (LO) at second input terminals 15. A differential signal $IF_{OUT}$ down-converted in frequency from the RF frequency range to the IF frequency range is supplied at output terminals (34).

10 Claims, 1 Drawing Sheet

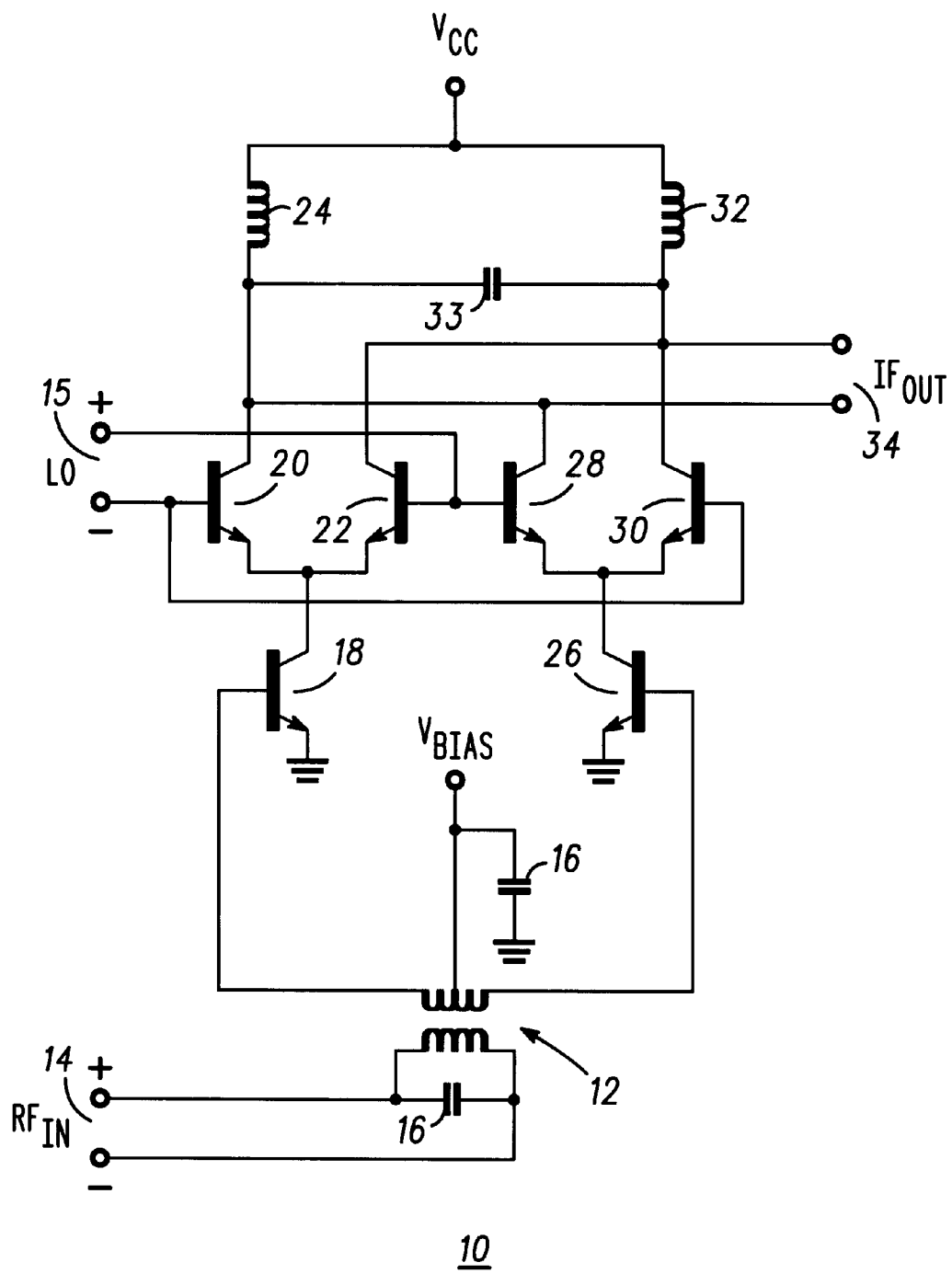

DOUBLE BALANCED MIXER CIRCUIT

This invention is related, in general, to signal conversion and, more specifically, to signal conversion using a double balanced mixer circuit.

It is common in a transceiver circuit that the received signal be down-converted in frequency from the Radio Frequency (RF) range to the Intermediate Frequency (IF) range. The transceiver in a cellular phone employs a mixer circuit that typically receives both the RF input signal from an antenna and a locally generated oscillator signal. The mixer generates an output signal having a frequency that is the difference between the frequency of the RF signal and the frequency of the oscillator signal, thus mixing the frequency of the received signal down to the IF frequency range.

A cost-effective mixer is needed having a lower noise FIGURE and a higher third order intermodulation product (IP3) to improve the sensitivity of phones.

BRIEF DESCRIPTION OF THE DRAWING

The sole FIGURE is a circuit diagram of an integrated mixer circuit having a transformer for receiving an RF signal.

DETAILED DESCRIPTION OF THE DRAWING

The sole FIGURE is a circuit diagram for an integrated mixer circuit 10 having a transformer 12 integrated with the other electronic devices. Mixer circuit 10, also referred to as a double balanced mixer circuit, includes a transformer 12 having the primary side connected to a pair of terminals 14 for receiving the Radio Frequency signal ($RF_{IN}$). A capacitor 13 is connected across terminals 14 and the capacitance value is selected to resonate with transformer 12 at the desired $RF_{IN}$ frequency. In the preferred embodiment transformer 12 has three turns on the primary side and three turns on the secondary side, the secondary side further including a center tap that is coupled for receiving a bias voltage ($V_{BIAS}$). A capacitor 16, having a capacitance value of about 10 picofarad (pf), is coupled from the center tap on the secondary side to a ground power conductor.

A first differential transistor pair includes transistors 20 and 22 and a second differential transistor pair includes transistors 28 and 30. The first and second differential transistor pairs collectively form the mixer's balanced switching circuit. The commonly connected emitters of transistors 20 and 22 are connected to the collector of a transistor 18 and the commonly connected emitters of transistors 28 and 30 are connected to the collector of a transistor 26. Transistors 18 and 26 form the transconductor portion of integrated mixer circuit 10. The emitter of transistor 18 and the emitter of transistor 26 are connected to the ground power conductor forming a common-emitter topology transconductor. Characteristics of the common-emitter topology are high current gain and low noise FIGURE, but typically poor IP3. The base of transistor 18 is connected to one terminal on the secondary side of transformer 12 and the base of transistor 26 is connected to the other terminal on the secondary side of transformer 12.

The commonly connected base of transistor 22 and base of transistor 28 is connected to one terminal 15, while the other terminal 15 is connected to the base of transistor 20 and to the base of transistor 30. Terminals 15 receive a differential local oscillator signal (LO). The collector of transistor 20 is connected to the collector of transistor 28 and further coupled through a load device 24 to a power conductor for receiving the voltage $V_{CC}$. The collector of transistor 22 is connected to the collector of transistor 30 and further coupled through a load device 32 to the power conductor for receiving the voltage $V_{CC}$. Load devices 24 and 32 are shown in the FIGURE as inductors, however, it should be noted that the load devices could be resistors or a parallel combination of inductors and resistors. The common connection of the collectors of transistors 20 and 28 are further connected to one of the output terminals 34, while the other output terminal 34 is connected to the collectors of transistors 22 and 30. A differential Intermediate Frequency signal ($IF_{OUT}$) is supplied at terminals 34. A capacitor 33 is coupled between the pair of terminals 34. Although not shown in this embodiment, a resistor could also be coupled between terminals 34.

In operation, mixer circuit 10 receives the signal $RF_{IN}$ typically from the transceiver antenna (not shown) and the signal LO from a local oscillator circuit (also not shown). Transformer 12 is physically small and has a low value of inductance which resonates at the desired RFIN frequency, but keeps the bases of transistors 18 and 26 shorted together at low frequencies. Therefore, the transformer attenuates any differential-mode f2–f1 distortion across the bases of transistors 18 and 26, enhancing the IP3, i.e., the third order intermodulation product, of integrated mixer circuit 10. The frequencies f2 and f1 are the classical closely spaced RF input tones used for linearity testing. The center tap of transformer 12 receives a voltage value $V_{BIAS}$, for example, of about 0.8 volt that keeps transistors 18 and 26 biased in their linear regions. Capacitor 16 provides an Alternating Current (AC) ground at the center tap point of transformer 12. Capacitor 16 effectively shorts out the common-mode f2 –f1 distortion, further enhancing the mixer IP3. The differential signal RFIN supplied across the secondary terminals of transformer 12 is unaffected by capacitor 16 because that capacitor is connected at a virtual ground for $RF_{IN}$.

Transistors 18 and 26 steer the current into the first differential transistor pair, i.e., transistors 20 and 22, or the second differential transistor pair, i.e., transistors 28 and 30, in accordance with the received signal $RF_{IN}$. The differential signal LO received at terminals 15, in combination with the currents flowing in transistors 18 and 26, determine the differential signal $IF_{OUT}$ supplied at output terminals 34. The differential signal $IF_{OUT}$ has a frequency that is the difference between the frequencies of the signals $RF_{IN}$ and LO. Thus, the signal $IF_{OUT}$ is down-converted in frequency from the RF frequency range to the IF frequency range.

By now it should be appreciated that a double balanced mixer circuit has been shown where the RF input signal is received at the primary side of a transformer. The secondary side of the transformer connects to the base terminals of the transistors controlling the tail currents in a pair of differential transistors. The common-emitter configuration normally does not provide high linearity. However, the configuration shown in accordance with the present invention exploits the high gain, low noise properties of a common-emitter mixer and improves the linearity by attenuating, both in a common mode and a differential mode, the f2–f1 distortion.

What is claimed is:

1. An integrated double balanced mixer having first and second differential transistor pairs, the first differential transistor pair including first and second transistors with commonly connected first conducting terminals and the second differential transistor pair including third and fourth transistors with commonly connected first conducting terminals, the integrated double balanced mixer comprising:

a fifth transistor having a first current conducting terminal coupled to the first conducting terminals of the first differential transistor pair and a second current conducting terminal coupled to a power conductor;

a sixth transistor having a first current conducting terminal coupled to the first conducting terminals of the second differential transistor pair and a second current conducting terminal coupled to the power conductor; and a transformer having a primary side with first and second terminals coupled for receiving a signal and a secondary side with first and second terminals coupled to control terminals of the fifth and sixth transistors.

2. The integrated double balanced mixer of claim 1, wherein the secondary side of the transformer further comprises a center tap coupled for receiving a bias voltage.

3. The integrated double balanced mixer of claim 2, further comprising a first capacitor coupled between the center tap and the power conductor.

4. The integrated double balanced mixer of claim 3, further comprising a second capacitor coupled between the first and second terminals on the primary side of the transformer.

5. An integrated mixer circuit, comprising:

a transformer having a primary side with first and second terminals coupled for receiving a signal and a secondary side with first and second terminals;

first and second transistors of a first differential transistor pair having commonly coupled first conducting terminals;

third and fourth transistors of a second differential transistor pair having commonly coupled first conducting terminals;

a fifth transistor having a first current conducting terminal coupled to the first conducting terminals of the first differential transistor pair, a second current conducting terminal coupled to a first power conductor and a control terminal coupled to the first terminal on the secondary side of the transformer; and a sixth transistor having a first current conducting terminal coupled to the first conducting terminals of the second differential transistor pair, a second current conducting terminal coupled to the first power conductor and a control terminal coupled to the second terminal on the secondary side of the transformer.

6. The integrated mixer circuit of claim 5, wherein the secondary side of the transformer further includes a center tap coupled for receiving a bias voltage.

7. The integrated mixer circuit of claim 6, further comprising a first capacitor coupled between the center tap and the first power conductor.

8. The integrated mixer circuit of claim 7, further comprising a second capacitor coupled between the first and second terminals on the primary side of the transformer.

9. The integrated mixer circuit of claim 5, wherein the first, second, third, fourth, fifth and sixth transistors are NPN transistors.

10. The integrated mixer circuit of claim 5, further comprising:

a first inductor having a first terminal coupled to the second conducting terminals of the first and third transistors and a second terminal coupled to a second power conductor; and a second inductor having a first terminal coupled to the second conducting terminals of the second and fourth transistors and a second terminal coupled to the second power conductor.

* * * * *